United States Patent
Park et al.

(10) Patent No.: US 9,882,404 B2
(45) Date of Patent: Jan. 30, 2018

(54) METHOD AND APPARATUS FOR POWER MANAGEMENT

(71) Applicant: Samsung Electronics Co., Ltd., Gyeonggi-do (KR)

(72) Inventors: Jin-Seok Park, Gyeonggi-do (KR); Se-Jun Song, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 283 days.

(21) Appl. No.: 14/690,668

(22) Filed: Apr. 20, 2015

(65) Prior Publication Data

US 2015/0311737 A1 Oct. 29, 2015

(30) Foreign Application Priority Data

Apr. 28, 2014 (KR) .................. 10-2014-0050720

(51) Int. Cl.
*H02J 7/00* (2006.01)
*G01R 31/36* (2006.01)
*G06F 1/28* (2006.01)
*G06F 1/32* (2006.01)
*G06F 3/0484* (2013.01)

(52) U.S. Cl.
CPC ........ *H02J 7/0063* (2013.01); *G01R 31/3606* (2013.01); *G01R 31/3648* (2013.01); *G06F 1/28* (2013.01); *G06F 1/3212* (2013.01); *G06F 1/3287* (2013.01); *G06F 3/04847* (2013.01); *H02J 2007/0067* (2013.01); *Y02B 60/1282* (2013.01); *Y02B 60/1292* (2013.01)

(58) Field of Classification Search
CPC ............ H02J 7/0063; H02J 2007/0067; G06F 3/04847; G06F 1/28; G06F 1/3212; G06F 1/3287; G01R 31/3606; G01R 31/3648
See application file for complete search history.

(56) References Cited

U.S. PATENT DOCUMENTS

| 6,628,972 | B1 | 9/2003 | Lee | |
|---|---|---|---|---|
| 7,233,127 | B2 * | 6/2007 | Chen | ......................... H02J 1/14 320/106 |
| 7,366,921 | B2 * | 4/2008 | Ranganathan | ........ G06F 1/3215 713/300 |
| 7,383,451 | B2 * | 6/2008 | Matsushima | ......... G06F 1/3287 713/300 |

(Continued)

FOREIGN PATENT DOCUMENTS

| KR | 2000-0010344 A | 2/2000 |
|---|---|---|
| KR | 10-2005-0002667 A | 1/2005 |
| KR | 10-2006-0073295 A | 6/2006 |

(Continued)

*Primary Examiner* — Kenneth B Wells
(74) *Attorney, Agent, or Firm* — Cha & Reiter, LLC.

(57) ABSTRACT

An electronic device is provided including a battery and a controller configured to: measure a present level of the battery; and adjust an operation of a hardware component of the electronic device based on the present level of the battery in order to maintain a reference battery level, wherein the reference battery level is associated with a specified time period in which the electronic device is required to remain operational.

14 Claims, 13 Drawing Sheets

(56) References Cited

U.S. PATENT DOCUMENTS

| | | | |
|---|---|---|---|
| 8,250,384 B2* | 8/2012 | Borghetti | G06F 1/3203 |
| | | | 713/300 |
| 2004/0268159 A1 | 12/2004 | Aasheim et al. | |

FOREIGN PATENT DOCUMENTS

| KR | 10-2006-0082912 A | 7/2006 |
|---|---|---|
| KR | 10-2007-0058214 A | 6/2007 |
| KR | 10-2011-0016308 A | 2/2011 |
| KR | 10-2012-0129257 A | 11/2012 |

* cited by examiner

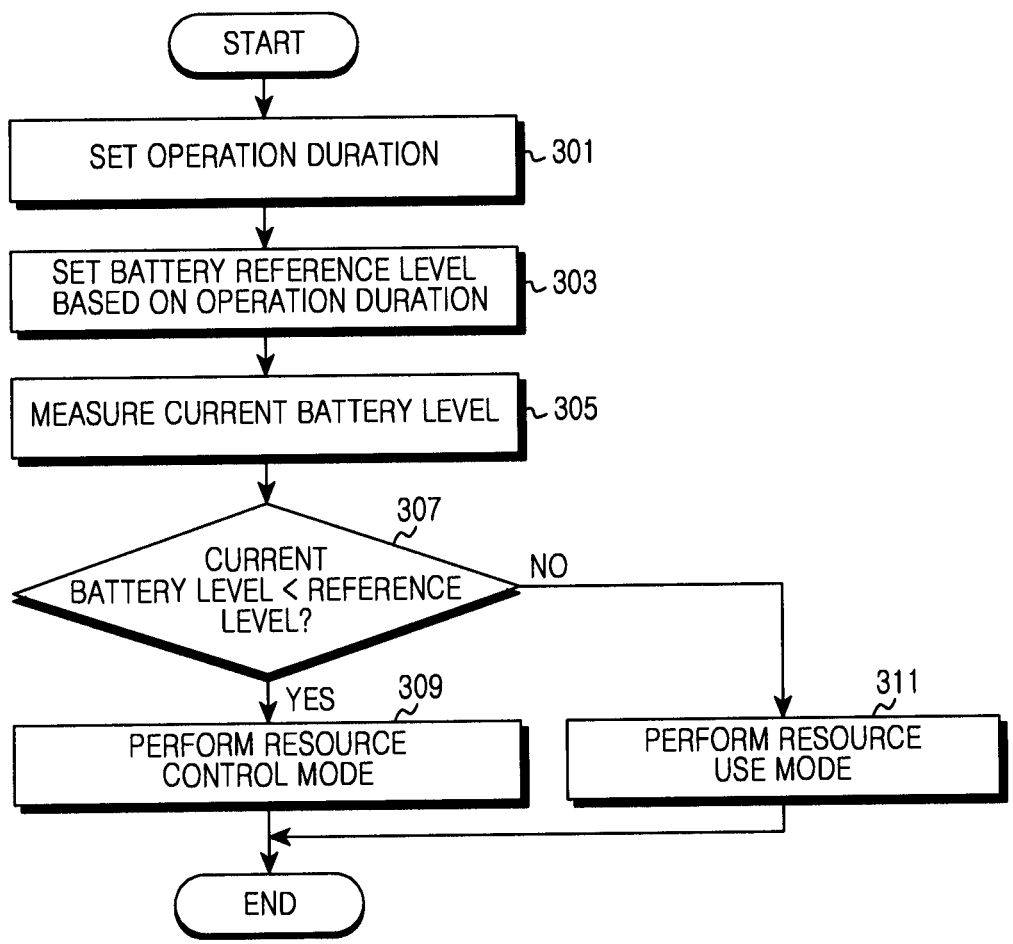
FIG.3
(REPLACEMENT SHEET)

| RESOURCE / FUNCTION | CPU | GPU | BACKLIGHT | SENSOR | GPS | WiFi/BT | FRAMERATE | AUDIO |
|---|---|---|---|---|---|---|---|---|
| PHONE | | | ✓ | ✓ | | | | ✓ |
| VIDEO | ✓ | | ✓ | ✓ | | | ✓ | ✓ |
| NAVIGATION | ✓ | ✓ | | | ✓ | | | |
| INTERNET | ✓ | ✓ | ✓ | | | ✓ | | |
| mp3 | | | | | | | | ✓ |
| MOTION | | ✓ | | ✓ | | | | |
| SNS | ✓ | | ✓ | | | ✓ | | |
| 3D GAME | ✓ | ✓ | ✓ | ✓ | | | ✓ | |

FIG.8

| LEVEL | CONTROL RESOURCE |
|---|---|
| Lv. 1 | BT, WiFi |
| Lv. 2 | CPU, GPU, BT, WiFi |
| Lv. 3 | Display, RF, NFC, CPU, GPU, BT, WiFi |

FIG.9A

| LEVEL | CONTROL RESOURCE |
|---|---|
| LEVEL 1 | CPU = MAX 90% |
| LEVEL 2 | CPU = MAX 80% |
| LEVEL 3 | CPU = MAX 70% |

FIG.10A

METHOD AND APPARATUS FOR POWER MANAGEMENT

CLAIM OF PRIORITY

This application claims priority under 35 U.S.C. § 119(a) to a Korean Application Serial No. 10-2014-0050720, which was filed in the Korean Intellectual Property Office on Apr. 28, 2014, the entire content of which is hereby incorporated by reference.

BACKGROUND

1. Field of the Disclosure

Various embodiments relate to electronic devices and, more particularly to a method and apparatus for power management.

2. Description of the Related Art

Recently, with the rapid growth of electronic devices, electronic devices enabling wireless voice telephony and information exchange have become the necessities of life. In the beginning of spreading of the electronic devices, it was simply recognized that the electronic devices are portable and their wireless telephony is possible. But, with the development of their technologies and the introduction of wireless Internet, the electronic devices are satisfying users' desires by significantly increasing a scope of utility such as game, remote control using short-range communication, and image taking using an installed digital camera as well as the purpose of simple telephony, schedule management or the like.

To reduce their power consumption, electronic devices can enter a low power mode. The low power mode can be an operation of applying low power to a module causing power consumption of a threshold value or more in the electronic device. For example, if no user's input is sensed during a certain time, the electronic devices can process to apply low power to a backlight module, a short-range communication module, and the like.

SUMMARY

According to aspects of the disclosure, an electronic device is provided comprising a battery and a controller configured to: measure a present level of the battery; and adjust an operation of a hardware component of the electronic device based on the present level of the battery in order to maintain a reference battery level, wherein the reference battery level is associated with a specified time period in which the electronic device is required to remain operational.

According to aspects of the disclosure, a method is provided comprising: detecting an input specifying a time period during which an electronic device is required to remain operational; measuring a present level of a battery of the electronic device; and based on the present level of the battery, adjusting an operation of a hardware component of the electronic device to maintain a reference battery level, wherein the reference battery level is associated with a specified time period in which the electronic device is required to remain operational.

According to aspects of the disclosure, a non-transitory computer-readable medium is provided that stores processor-executable instructions, which when executed by a processor cause the processor to perform a process comprising the steps of: detecting an input specifying a time period during which an electronic device is required to remain operational; measuring a present level of a battery of the electronic device; and based on the present level of the battery, adjusting an operation of a hardware component of the electronic device to maintain a reference battery level, wherein the reference battery level is associated with a specified time period in which the electronic device is required to remain operational.

BRIEF DESCRIPTION OF THE DRAWINGS

The above and other objects, features and advantages of the present disclosure will become more apparent from the following detailed description when taken in conjunction with the accompanying drawings in which:

FIG. 3 is a flowchart of an example of a process for power management, according to various embodiments of the present disclosure;

FIG. 8 is a diagram of an example of a data structure that provides a mapping between various resources and functions of the electronic device, according to various embodiments of the disclosure;

FIG. 9A, is a diagram of an example of a data structure mapping different battery levels to different device resources, according to various embodiments of the disclosure;

FIG. 10A, is a diagram of an example of a data structure mapping different battery levels to different device resources, according to various embodiments of the disclosure;

DETAILED DESCRIPTION

Figure 1:
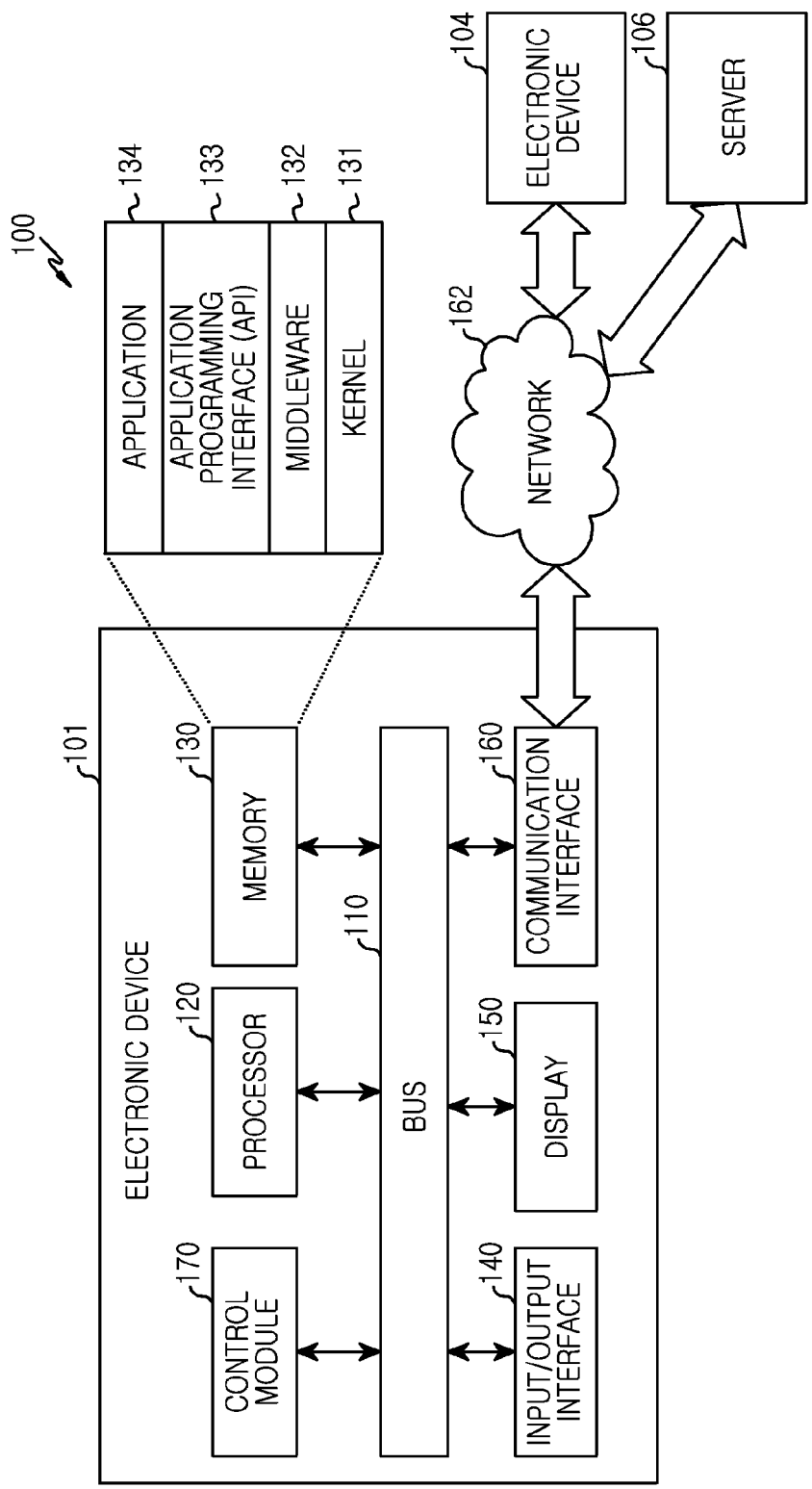
FIG. 1 illustrates a network environment including an electronic device according to various embodiments of the present disclosure.

Hereinafter, the present disclosure is described with reference to the accompanying drawings. The present disclosure may be changed variously and have various embodiments, and specific embodiments are provided as examples and related detailed descriptions are made in the present specification. However, it should be understood that the various embodiments of the present disclosure are not limited to a specific embodied form and include all modifications and/or equivalents or substitutions that fall within the spirit and technical scope of the present disclosure. In the drawing, like reference numerals are used for like elements.

Expressions such as "include" or "may include", etc. that may be used for the present disclosure indicate existence of a disclosed relevant function, operation, or element, etc., and do not limit additional one or more functions, operations, or elements, etc. Also, it should be understood that terminologies such as "include" or "have", etc. in the present disclosure are intended for designating existence of a characteristic, a number, a step, an operation, an element, a part, or a combination of these described on the specification and do not exclude in advance existence or addition possibility of one or more other characteristics, numbers, steps, operations, elements, parts, or a combination of these.

Expression such as "or", etc. in the present disclosure includes a certain and all combinations of words listed together. For example, "A or B" may include A and may include B, or include both A and B.

In the present disclosure, expressions such as "1st", "2nd", "first" or "second", etc. may modify various elements of the present disclosure but do not limit relevant elements. For example, the expressions do not limit sequence and/or importance, etc. of relevant elements. The expressions may be used for discriminating one element from another element. For example, both a first user apparatus and a second user apparatus are all user apparatuses, and represent different user apparatuses. For example, a first element may be named as a second element without departing from the scope of the present disclosure, and similarly, the second element may be named as the first element.

When it is mentioned that a certain element is "connected to" or "accesses" another element, it should be understood that the element may be directly connected to another element or may directly access another element, but still another element may exist in the middle. In contrast, when it is mentioned that a certain element is "directly connected to" or "directly accesses" another element, it should be understood that still another element does not exist in the middle.

A terminology used in the present disclosure is used for explaining only a specific embodiment and is not intended for limiting the present disclosure. Unless clearly expressed otherwise, expression of the singular includes expression of the plural.

Unless defined differently, all terminologies used herein including technological or scientific terminologies have the same meaning as that generally understood by a person of ordinary skill in the art to which the present disclosure belongs. It should be understood that generally used terminologies defined by a dictionary have meaning coinciding with meaning on context of a related technology, and unless clearly defined in the present disclosure, they are not understood as an ideal or excessively formal meaning.

An electronic device according to the present disclosure may be a device including a communication function. For example, an electronic device may include at least one of a smartphone, a tablet personal computer (PC), a mobile phone, a video phone, an e-book reader, a desktop PC, a laptop PC, a netbook computer, a Personal Digital Assistant (PDA), a Portable Multimedia Player (PMP), an MP3 player, a mobile medical device, a camera, or a wearable device (e.g., a head-mounted-device (HMD) such as electronic glasses, an electronic clothing, an electronic bracelet, an electronic necklace, an electronic appcessory, an electronic tattoo, or a smartwatch).

According to certain embodiments, an electronic device may be a smart home appliance having a communication function. A smart home appliance may include, for example, at least one of a television, a Digital Video Disk (DVD) player, an audio, a refrigerator, an air conditioner, a cleaner, an oven, an electronic range, a washing machine, an air purifier, a set-top box, a TV box (e.g., Samsung HomeSync™, Apple TV™, or Google TV™), game consoles, an electronic dictionary, an electronic key, a camcorder, or an electronic frame.

According to certain embodiments, an electronic device may include at least one of various medical devices (e.g., Magnetic Resonance Angiography (MRA), Magnetic Resonance Imaging (MRI), Computed Tomography (CT), a shooting device, an ultrasonic device, etc.), a navigation device, a Global Positioning System (GPS) receiver, an event data recorder (EDR), a flight data recorder (FDR), an automobile infotainment device, electronic equipment for a ship (e.g., a navigation device for a ship, a gyro compass, etc.), an avionics, a security device, or a robot for an industrial use or a home use.

According to certain embodiments, an electronic device may include at least one of a furniture or a portion of a building/structure including a communication function, an electronic board, an electronic signature receiving device, a projector, or various measurement devices (e.g., waterworks, electricity, gas, or radio wave measuring device, etc.). An electronic device according to the present disclosure may be a combination of one or more of the above-described devices. Also, it is obvious to a person of ordinary skill in the art that the electronic device according to the present disclosure is not limited to the above-described devices.

Hereinafter, an electronic device according to various embodiments of the present disclosure is described with reference to the accompanying drawings. A terminology of a user used in various embodiments may indicate a person who uses an electronic device or a device (e.g., an artificial intelligence electronic device) that uses the electronic device.

FIG. 1 is a view illustrating a network environment 100 including an electronic device 101 according to various embodiments. Referring to FIG. 1, the electronic device 101 may include a bus 110, a processor 120, a memory 130, an input/output (I/O) interface 140, a display 150, a communication interface 160, and a control module 170.

The bus 110 may be a circuit for connecting the above-described elements with each other, and transferring communication (e.g., a control message) between the above-described elements.

The controller 120 may include any suitable type of processing circuitry, such as one or more of a general-purpose processor (e.g., an ARM-based processor), an Application-Specific Integrated Circuit (ASIC), a Field-Programmable Gate Array (FPGA), and/or a Digital Signal Processor (DSP). The processor 120 may receive, for example, an instruction from the above-described other elements (e.g., the memory 130, the I/O interface 140, the display 150, the communication interface 160, or the control module 170, etc.) via the bus 110, decipher the received instruction, and execute an operation or a data process corresponding to the deciphered instruction.

The memory 130 may store an instruction or data received from the processor 120 or other elements (e.g., the I/O interface 140, the display 150, the communication interface 160, or the control module 170, etc.), or generated by the processor 120 or other elements. The memory 130 may include, for example, programming modules such as a kernel 131, a middleware 132, an application programming interface (API) 133, or an application 134. Each of the programming modules may be configured using software, firmware, hardware, or a combination of two or more of these.

The kernel 131 may control or manage system resources (e.g., the bus 110, the processor 120, or the memory 130, etc.) used for executing an operation or a function implemented in the rest of the programming modules, for example, the middleware 132, the API 133, or the application 134. Also, the kernel 131 may provide an interface for allowing the middleware 132, the API 133, or the application 134 to access an individual element of the electronic device 101 and control or manage the same.

The middleware 132 may perform a mediation role so that the API 133 or the application 134 may communicate with the kernel 131 to give and take data. Also, in connection with task requests received from the applications 134, the middleware 132 may perform a control (e.g., scheduling or load balancing) for a task request using, for example, a method of assigning priority that may use a system resource (e.g., the bus 110, the processor 120, or the memory 130, etc.) of the electronic device 101 to at least one of the applications 134.

The API 133 is an interface for allowing the application 134 to control a function provided by the kernel 131 or the middleware 132, and may include at least one interface or function (e.g., an instruction) for file control, window control, image processing, or character control, etc.

According to various embodiments, the application 134 may include an SMS/MMS application, an e-mail application, a calendar application, alarm application, a health care application (e.g., an application for measuring quantity of motion or blood sugar, etc.), or an environment information application (e.g., an application providing atmospheric pressure, humidity or temperature information, etc.). Additionally or alternatively, the application 134 may be an application related to information exchange between the electronic device 101 and an external electronic device (e.g., the electronic device 104). The application related to the information exchange may include, for example, a notification relay application for transferring specific information to the external electronic device or a device management application for managing the external electronic device.

For example, the notification relay application may include a function for transferring notification information generated from a different application (e.g., an SMS/MMS application, an e-mail application, a health care application, or an environment information application) of the electronic device 101 to an external electronic device (e.g., the electronic device 104). Additionally or alternatively, the notification relay application may, for example, receive notification information from an external electronic device (e.g., the electronic device 104) and provide the same to a user. The device management application may manage (e.g., install, delete, or update) a function (e.g., turn-on/turn-off of an external electronic device itself (or some constituent part) or luminance (or resolution) control of a display) of an external electronic device (e.g., the electronic device 104) communicating with the electronic device 101 and an application operating in the external electronic device or a service (e.g., a communication service or a message service) provided by the external electronic device.

According to various embodiments, the application 134 may include a designated application depending on an attribute (e.g., a kind of an electronic device) of the external electronic device (e.g., the electronic device 104). For example, in the case where the external electronic device is an MP3 player, the application 134 may include an application related to music reproduction. Similarly, in the case where the external electronic device is a mobile medical health care device, the application 134 may include an application related to health care. According to an embodiment, the application 134 may include at least one of an application designated in the electronic device 101 and an application received from the external electronic device (e.g., the server 106 or the electronic device 104).

The I/O interface 140 may transfer an instruction or data input from a user via an I/O unit (e.g., a sensor, a keyboard, or a touchscreen) to the processor 120, the memory 130, the communication interface 160, or the control module 170 via the bus 110, for example. For example, the I/O interface 140 may provide data regarding a user's touch input via the touchscreen to the processor 120. Also, the I/O interface 140 may, for example, output an instruction or data received via the bus 110 from the processor 120, the memory 130, and the communication interface 160, or the control module 170 via the I/O unit (e.g., a speaker or a display). For example, the I/O interface 140 may output voice data processed by the processor 120 to a user via a speaker.

The display 150 may display various information (e.g., multimedia data or text data, etc.) to a user.

The communication interface 160 may connect communication between the electronic device 101 with an external device (e.g., the electronic device 104 or the server 106). For example, the communication interface 160 may be connected with a network 162 via wireless communication or wired communication to communicate with the external device. The wireless communication may, for example, include at least one of Wireless Fidelity (Wi-Fi), Bluetooth (BT), Near Field Communication (NFC), Global Positioning System (GPS), or cellular communication (e.g., LTE, LTE-A, CDMA, WCDMA, UMTS, WiBro, or GSM, etc.). The wired communication may include, for example, at least one of Universal Serial Bus (USB), High Definition Multimedia Interface (HDMI), recommended standard 232 (RS-232), and plain old telephone service (POTS).

According to an embodiment, the network 162 may be a telecommunications network. The telecommunications network may include at least one of a computer network, the Internet, an Internet of things, and a telephone network. According to an embodiment, a protocol (e.g., a transport layer protocol, a data link layer protocol, or a physical layer protocol) for communication between the electronic device 101 and an external device may be supported by at least one of the application 134, the application programming interface 133, the middleware 132, the kernel 131, or the communication interface 160.

According to one embodiment, for instance, the control module 170 may sense a user's request (for example, a gesture input, a key input, a touch input, a voice instruction input, and the like), and set a time for guaranteeing an operation of the electronic device 101.

The control module 170 may process to maintain a predefined battery level by time such that the electronic device 101 can normally operate during the set time.

According to various embodiments, the control module 170 may control resources of the electronic device 101 in accordance with a battery level measured by time such that the predefined battery level can be maintained. For example, the control module 170 may increase the number of deactivated resources or decrease the performance of controlled resources at a time point at which a battery consumption amount is large.

Additional information about the control module 170 is provided through FIG. 2 to FIG. 10 described later.

Figure 2:
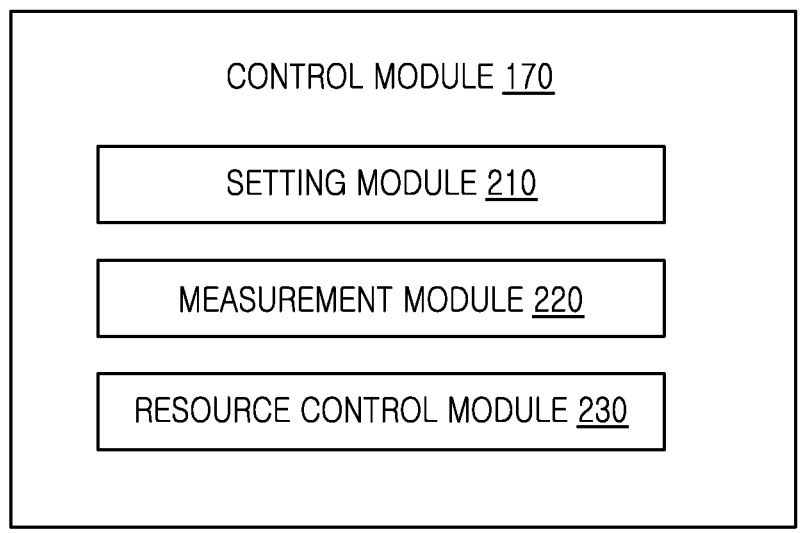
FIG. 2 is a diagram of an example of a control module, according to various embodiments of the present disclosure.

FIG. 2 is a diagram of an example of a control module 170 according to various embodiments of the present disclosure.

Referring to FIG. 2, the control module 170 may include a setting module 210, a measurement module 220, and a resource control module 230.

The setting module 210 may sense a user's request (for example, a gesture input, a key input, a touch input, a voice instruction input, and the like), and set an operation duration of the electronic device 101.

According to aspects of the disclosure, the operation duration may be a time period during which the electronic device 101 is required to remain operational.

According to one embodiment, the operation duration may be a specific time period. For example, a user may need a contact with a conference participant at a conference start time point, and the setting module 210 may set the operation duration on a basis of a conference start time.

According to another embodiment, the operation duration may be variable. For example, the user may have a conference and the setting module 210 may set the operation duration to equal the duration of the conference call.

The setting module 210 may provide a user interface capable of setting the operation duration. According to various embodiments, the setting module 210 may provide the user interface capable of setting the operation duration based on a current battery level or battery consumption amount. For example, the setting module 210 may indicate to the user a maximum operation duration that is possible given the device's current battery level (e.g., 30% of the whole battery amount).

The measurement module 220 may measure a battery level based on a variable period. According to various embodiments, the variable period may include a predefined period.

The measurement module 220 may set a battery reference level for the set operation duration. For example, the battery reference level may include information usable for determining whether to enter a low power mode in order to guarantee an operation duration of the electronic device 101.

The resource control module 230 may cause the device 101 to enter the low power mode based on a present battery level measured by the measurement module 220. For example, causing the device 101 to enter the low power mode may include restricting one or more resources of the device 101.

According to one embodiment, the resource control module 230 may compare a current battery level and the battery reference level that is set by the setting module 210 and enter the low power mode. For example, if the current battery level is equal to or less than the battery reference level, the resource control module 230 may turn off one or more resources that are in operation, and/or reduce the performance level of the resources. For example, the resources may include a Central Processing Unit (CPU), a Graphics Processing Unit (GPU), a sensor, a Global Positioning System (GPS), Wireless Fidelity/Bluetooth (WIFI/BT), and the like. If a condition for entering the low power mode is satisfied, the resource control module 230 may proceed to deactivate all or some of the resources, except the CPU, and guarantee that the electronic device 101 remains operational for the entire operation duration. According to another embodiment, the resource may include at least one application which is presently working in the electronic device 101.

According to various embodiments, after defining a battery level or current battery consumption amount by a plurality of grades, the resource control module 230 may change a resource control method in accordance with the grade. For example, a grade of the least battery consumption amount may be a grade 1, and a grade of the most battery consumption amount may be a grade 3. The resource control module 230 may deactivate only a GPS among currently activated resources, for example, a CPU, a sensor, and the GPS when detecting the first grade, and may deactivate all resources except the CPU when detecting the third grade. As another example, in the above-assumed situation, the resource control module 230 may lower the performance level the currently activated resources, for example, the CPU, the sensor, and the GPS to operate at 90% of their full capacity when detecting the first grade, and cause the currently activated resources to operate at 70% of their full capacity when detecting the third grade.

According to various embodiments, the resource control module 230 may control the resources based on priorities that are assigned to a particular function. For example, in a case where a user sets a low priority of an SNS function, at low power mode entry, the resource control module 230 may restrict a resource associated with the SNS function, for example, a WiFi resource. As another example, when the user sets a high priority to a game function, at low power mode entry, the resource control module 230 may operate without restriction a resource connected with the game function, for example, in place of a GPU resource, and restrict another resource instead.

According to various embodiments, if a battery level periodically measured by the measurement module 210 is equal to or is greater than the battery reference level, the resource control module 230 may process to release a low power mode and remove one or more restrictions that are placed on the resources of the device 101.

According to various embodiments, an electronic device may include a measurement module for measuring a battery level based on a variable period, and a resource control module for controlling resources of the electronic device to preserve a battery level required for operating during a predefined time, based on the battery level measured by the measurement module.

According to various embodiments, the resource control module may be configured to control at least any one of the number of resources corresponding to the battery level measured by the measurement module, the kind of the resources, and the performance of the resources.

According to various embodiments, the resource control module may be configured to control the controlled resource to be in a non-control state if checking that the predefined time arrives in course of controlling the resources while preserving the battery level.

According to various embodiments, the resource control module may be configured to compare the battery level and a predefined threshold value, and control a resource corresponding to the battery level of the threshold value.

According to various embodiments, the threshold value may be a reference value defining a battery level that is maintained as time goes in order to preserve a battery level required for operating during a predefined time.

According to various embodiments, the resource control module may be configured to check a resource that is controlled based on at least one of an importance and a priority order.

According to various embodiments, the electronic device may further include a memory for storing information about a resource that is controlled in accordance with the battery level.

According to various embodiments, an electronic device may include a battery and a controller. According to various embodiments, the controller is configured to measure a battery level of the battery based on a variable period, and control resources of the electronic device to preserve a battery level required for operating during a predefined time, based on the measured battery level.

FIG. 3 is a flowchart of an example of a process for power management, according to various embodiments of the present disclosure.

In operation 301, the electronic device 101 may set an operation duration for the electronic device 101. More particularly, the electronic device 101 may specify (e.g., based on user input) a time period for which the electronic device is required to remain operational.

Figure 5:
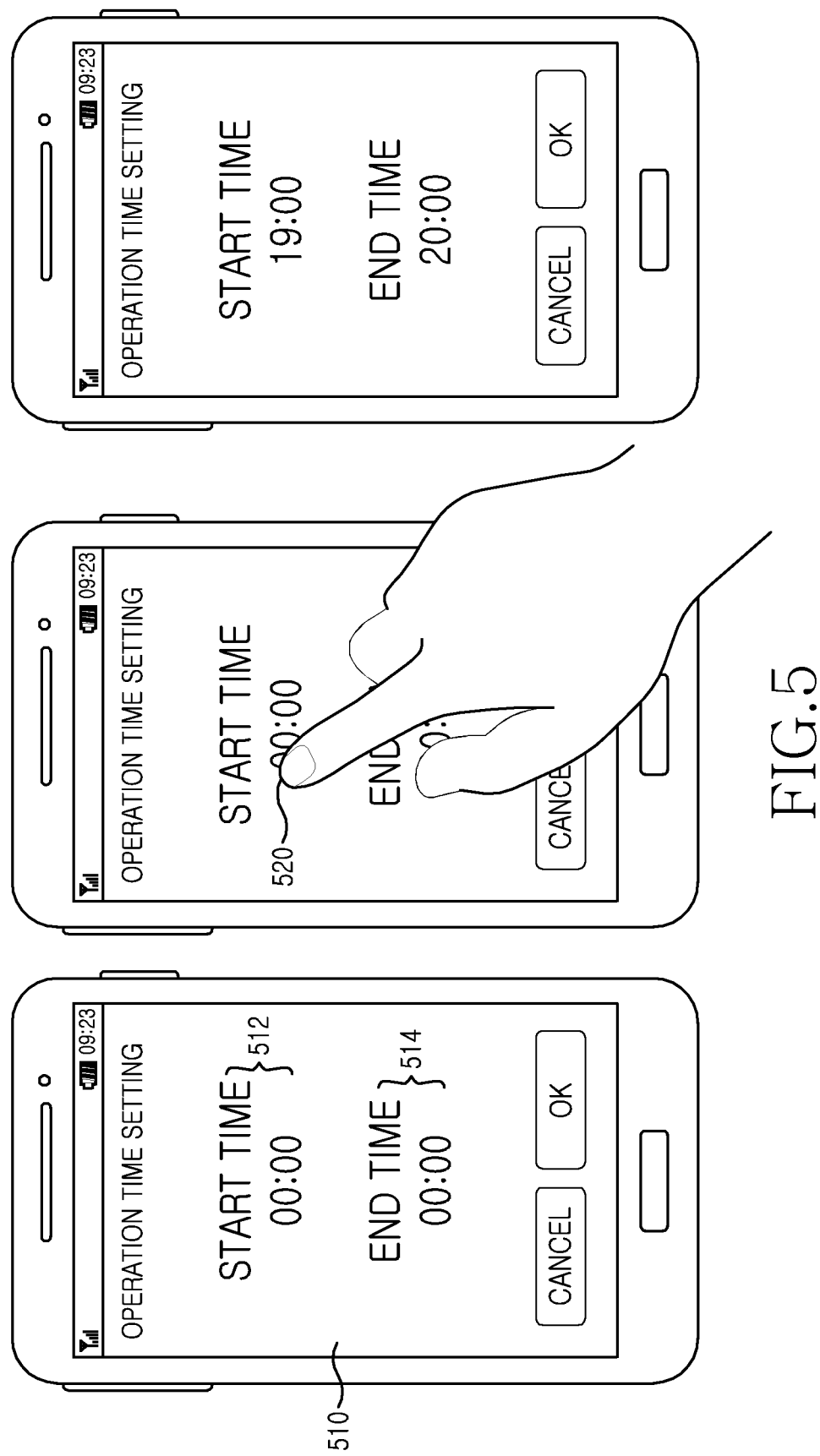
FIG. 5 is a diagram illustrating an example of a user interface for specifying operation duration, according to various embodiments of the present disclosure.
Figure 6:
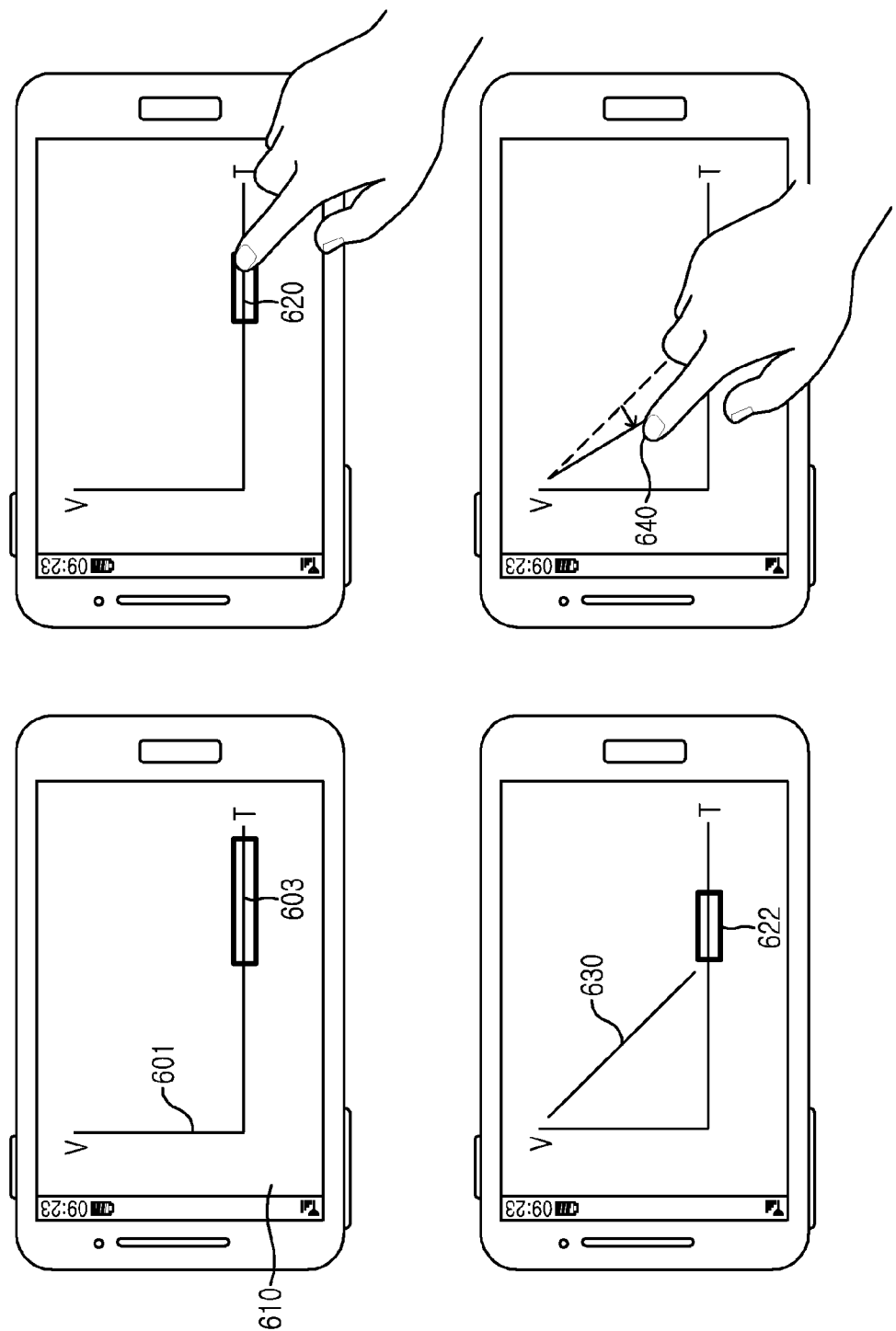
FIG. 6 is a diagram illustrating another example of a user interface for specifying operation duration, according to various embodiments of the present disclosure.

According to various embodiments, after outputting a setting screen including a field for designating the time period, the electronic device 101 may sense a user's request (for example, a gesture input, a key input, a touch input, a voice instruction input, and the like) and set an operation duration. According to one embodiment, the setting screen may include a field designating start and end time points of the operation duration. According to various embodiments, the electronic device 101 may set the operation duration as illustrated in FIG. 5 or FIG. 6.

According to various embodiments, after outputting a setting screen consisting of a graph showing a relationship between a battery level and time, the electronic device 101 may sense the user's request and set the operation duration. According to one embodiment, the electronic device 101 may output on the setting screen a range capable of setting the operation duration. For example, the electronic device 101 may predict the maximum range given the current battery level (or the present level) at the time of the user's request.

In operation 303, the electronic device 101 may set the battery reference level based on the operation duration. According to one embodiment, the battery reference level may be model of battery consumption to which the device 101 should adhere in order to remain operational for the entire operation duration. More precisely, the model may specify a set of threshold values that correspond to different time instants, which the device 101 needs to meet in order to remain operational for the entire operation duration.

In other words, to guarantee an operation of the electronic device 101 in the operation duration, the electronic device 101 may set a battery level that is maintained by time as the battery reference level. For example, if the operation duration of the electronic device 101 is set as two hours starting from a specific time, and the current battery level is equal to 50% on a basis of the whole battery amount, the electronic device 101 may predict a battery amount which will be used during a preset operation duration, for example, predict that 20% of the current battery level is needed. In this state, the electronic device 101 may set as the battery reference level a battery level that is maintained by time in a waiting state or in a state of executing a predefined function (e.g., a call transmission/reception function), from a current time point to an operation duration starting time point, by the remaining battery amount (for example, 30% of the current battery level) excepting a predicted battery amount from the current battery level. For example, the electronic device 101 may set as the battery reference level one-dimensional graph whose Y axis is the current battery level and X axis is a starting time point of the operation duration.

According to various embodiments, the electronic device 101 may adjust the battery reference level to guarantee the operation of the electronic device 101. For example, the electronic device 101 may increase the battery reference level in response to a user's request and remove restrictions from (or restrict) the resources accordingly.

In operation 305, the electronic device 101 may measure a current battery level (i.e., present battery level). According to one embodiment, the electronic device 101 may measure the battery level when a timer having a predefined time interval expires, a time point of sensing that a specific function is activated (for example, call reception, call outgoing, e-mail reception, and gesture input), and the like.

In operation 307, the electronic device 101 may perform an operation of comparing the measured battery level and a battery reference level corresponding to the time point (i.e., time instant) at which the present battery level measured. Based on the comparison, the electronic device 101 may the electronic device 101 may determine whether to restrict one or more of its resources.

According to various embodiments, as in operation 309, if the current battery level is less than the battery reference level, the electronic device 101 may perform a resource control mode. For example, the electronic device 101 may reduce the number of resources that are currently active (e.g., by deactivating one or more resources) or the performance level of the resources and control the current battery level to be equal to or greater than the reference level.

According to various embodiments, as in operation 311, if the current battery level is equal to or is greater than the battery reference level, the electronic device 101 may maintain the use of a resource without placing any restrictions on it.

Figure 4:
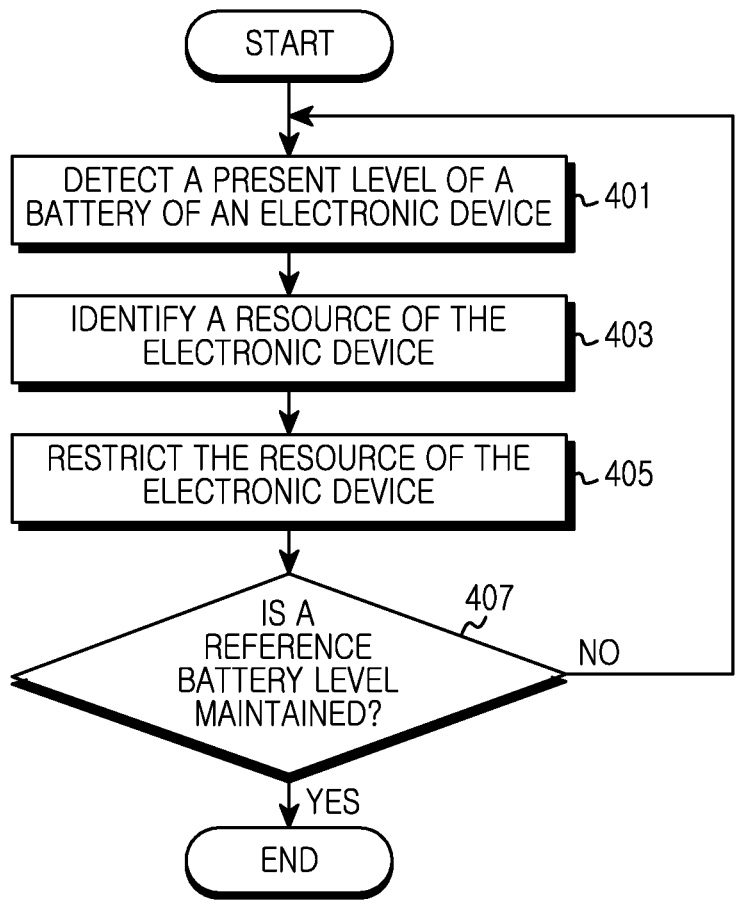
FIG. 4 is a flowchart of an example of a process, according to various embodiments of the present disclosure.

FIG. 4 is a flowchart of an example of process for power management, according to various embodiments of the present disclosure.

In operation 401, the electronic device 101 may detect a current battery level (e.g., a present level of the battery of the electronic device 101). According to various embodiments, the electronic device 101 may define a difference between a current battery level and a battery reference level by a plurality of levels, and may detect if the current battery level is different from the battery reference level by more than a predetermined amount.

In operation 403, the electronic device 101 may identify based on the present battery level, a resource whose operation is to be restricted. According to one embodiment, the electronic device 101 may associate a resource with one or more corresponding battery levels. For example, the electronic device 101 may define a use resource by function as illustrated in FIG. 8. According to various embodiments, the electronic device 101 may define resources that are controlled based on an importance, a priority order, and the like. For example, when a user sets an importance of an SNS function, the electronic device 101 may control a resource associated with a function not having an importance, such as a navigation function, a game function and the like. According to various embodiments, the electronic device 101 may change the performance level of a resource that in accordance with the current battery level. For example, when the battery level has a big difference with the battery reference level, the electronic device 101 may cause a resource operating at a maximum of 90% of its full capacity to operate at up to 70% of its full capacity. According to various embodiments, the electronic device 101 decrease the performance levels of the resources stepwise as a difference between the battery level and the battery reference level increases.

In operation 405, the electronic device 101 may restrict the operation of the identified resource based on the battery level.

In operation 407, the electronic device 101 may detect if a reference battery level is maintained. According to aspects of the disclosure, the reference battery level is maintained if the present battery level of the electronic device falls within the envelope defined by the reference battery level (i.e. the present level of the battery is greater than or equal to a value of the reference battery level that corresponds to the present time instant.)

According to various embodiments, if the reference battery level is maintained, the electronic device 101 may process to activate a deactivated resource or otherwise remove restrictions that have been previously placed on a resource. This may mean that the electronic device 101 may perform at least an operation desired by a user, in an operation duration, based on a battery level guaranteed through resource control.

According to various embodiments, if the reference battery level is not maintained, the electronic device 101 may once again perform the aforementioned resource control operation corresponding to the battery level and guarantee a battery level in order to guarantee an operation of the operation duration.

FIG. 5 is a diagram illustrating an example of a user interface for specifying operation duration, according to various embodiments of the present disclosure.

The electronic device 101 may output a setting screen 510 including a field capable of designating a time. According to one embodiment, the setting screen 510 may include a field designating start and end time points 512 and 514 of an operation duration.

The electronic device 101 may sense a user's request 520 and designate start and end time points of the operation duration. According to various embodiments, as illustrated, the electronic device 101 may sense a user's request about the operation duration time points, and may designate hour, minute, second, ante meridiem (a.m.), post meridiem (p.m.), and the like of a field designating the start time point of the operation duration. Though not illustrated, the electronic device 101 may sense a user's request and define the end time point of the operation duration too. The illustrated figure illustrates a situation of setting 19:00 to 20:00 as an operation duration of guaranteeing an operation of the electronic device 101. According to various embodiments, the electronic device 101 may secure a battery level to guarantee an operation of at least one or more functions defined by a user for the operation duration, or guarantee all functions capable of being provided in the electronic device 101 for the operation duration.

Although FIG. 5 illustrates a touch input as a user's request, in other implementations the user's request may include a gesture input, a key input, a voice instruction input, an electronic pen input, and the like.

FIG. 6 is a diagram illustrating another example of a user interface for specifying operation duration, according to various embodiments of the present disclosure.

The electronic device 101 may output a setting screen 610 consisting of a graph 601 relating a battery level (V) with time (T).

According to various embodiments, the electronic device 101 may output to the setting screen 610 a range 603 for setting an operation duration based on a current battery level.

According to various embodiments, the electronic device 101 may sense a user's request about the outputted settable range 603 and set an operation duration 620 within the settable range. The illustrated figure illustrates a situation of setting as operation duration a period that is two-thirds (⅔) of the size of the maximum operation duration that the device is capable of sustaining with the amount of power presently available in its battery.

According to various embodiments, if the operation duration is set, the electronic device 101 may set a battery reference level 630. For example, the battery reference level 630 may be used to judge a time point needing resource control in order to guarantee an operation of the electronic device 101 in at least the set operation duration. According to various embodiments, to guarantee an operation in the operation duration, the electronic device 101 may set a reference level. For example, the electronic device 101 may set as the battery reference level a battery amount by time consumed by an executed function at a time point at which the operation duration has been set.

According to various embodiments, if the battery reference level is set, the electronic device 101 may measure a battery level (i.e., a current battery level), and compare the measured battery level with the battery reference level, and reduce the battery consumption of the electronic device 101. If a battery level measured in a corresponding period is less than the battery reference level corresponding to the corresponding period, the electronic device 101 may control (e.g., restrict) resources of the electronic device 101 and enter a mode of reducing power consumption. According to various embodiments, if the battery level measured in the corresponding period is greater than the battery reference level corresponding to the corresponding period, the electronic device 101 may remove a restriction that is placed on a given resource of the electronic device.

According to various embodiments, the electronic device 101 may adjust a preset battery reference level and sufficiently guarantee an operation of the electronic device 101. For example, the electronic device 101 may decrease or increase the battery reference level correspondingly to a user's request 640 about the preset battery reference level. According to various embodiments, increasing the battery reference level may be controlling the resources frequently. As illustrated, if the battery reference level is decreased, a battery reference level corresponding to a time zone is decreased and resources may not be controlled before the battery level is consumed less than the battery reference level. In contrast, if the battery reference level is increased, the battery reference level corresponding to the time zone is increased and, though the battery level is consumed a little, the battery level is equal to or is less than the battery reference level, and the frequent occurrence of resource control may be brought about.

In FIG. 5, the setting and changing of the battery reference level are not described, but the setting and changing of the battery reference level are possible in a method of FIG. 6.

Figure 7:
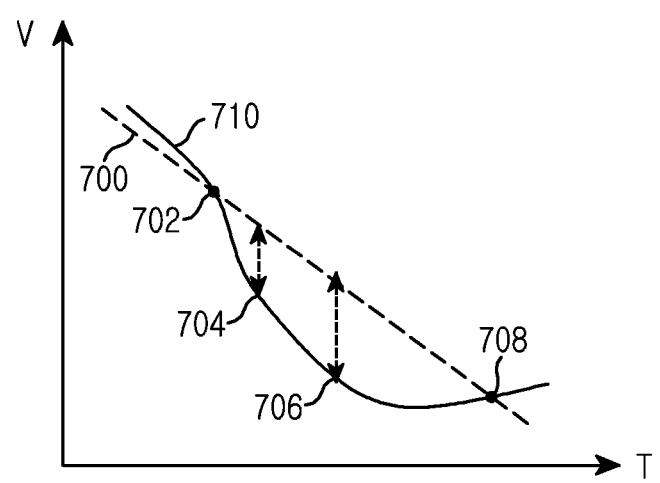
FIG. 7 is a time-series diagram comparing the present level of a battery of an electronic device with a reference battery level that needs to be maintained in order for the electronic device to remain operational during a specified time period, according to various embodiments of the disclosure.

FIG. 7 is a time-series diagram comparing the present level of a battery of an electronic device with a reference battery level that needs to be maintained in order for the electronic device to remain operational during a specified time period, according to various embodiments of the disclosure. The diagram includes a V-axis representing battery level, and a T-axis representing time.

According to various embodiments, the electronic device 101 may define a battery reference level 700 in order to remain operable for a particular operation duration, and may compare a current battery level 710 with the battery reference level 700 and control (e.g., restrict) resources of the electronic device 101, accordingly.

In the illustrated figure, the battery reference level 700 is denoted by a dotted line, and the battery level 710 of the electronic device 101 is denoted by a solid line.

According to various embodiments, after sampling its current battery level, the electronic device 101 may compare the current battery level with a value of the battery reference level 700 that corresponds to the time instant at which the sample is taken, and may control (e.g., restrict) resources of the electronic device 101 in order to maintain the reference battery level 700 (i.e., in order to bring battery level 710 within the bounds set by the reference battery level 700).

According to various embodiments, the electronic device 101 may adjust the number of resources that are restricted, and/or the degree to which the resources are restricted, in accordance with the magnitude of the difference between the battery reference level 700 and the present level of the battery of the device 100. For example, when the difference is large (e.g., difference 706), the electronic device 101 may restrict a plurality of resources. By contrast, when the difference is small (e.g., difference 704), the electronic device 101 may restrict only one resource.

According to various embodiments, the electronic device 101 may periodically detect its present battery level and pose additional restrictions on its resources, as needed.

Furthermore, the electronic device 101 may release a mode of controlling (e.g., restricting) resources of the electronic device 101, at a time point (708) at which the present battery level of the electronic device is equal to or greater than the battery reference level. For example, the electronic device 101 may activate (or increase the performance level thereof) a resource that has been restricted.

FIG. 8 is a diagram of an example of a data structure that provides a mapping between various resources and functions of the electronic device, according to various embodiments of the disclosure. The data structure may be stored in the memory of the electronic device 101 or elsewhere.

The electronic device 101 may perform various functions, for example, a phone function, a video function, a navigation function, an Internet function, and the like in accordance with a user's request, and may utilize at least one or more resources in order to execute the function.

For example, if the phone function is performed, the electronic device 101 may use a backlight resource, a sensor resource, and an audio resource which are associated with the phone function. Some of these resources may be necessary for the performance of the phone function may only be recommended. For example, a proximity sensor used to implement a phone mode change effect may not be a resource that is essentially required for the phone function.

According to various embodiments, to reduce battery consumption, the electronic device 101 may define each control (e.g., restrict) resource by function and control at least one resource associated with a function executed at a time point at which battery consumption is large. The control may be performed by using the depicted data structure.

According to various embodiments, the electronic device 101 may define a function or resource that is controlled when battery consumption is large. For example, the degree to which a given resource is restricted, if at all, may depend on a priority that has been assigned to a function associated with resource.

Figure 9B:
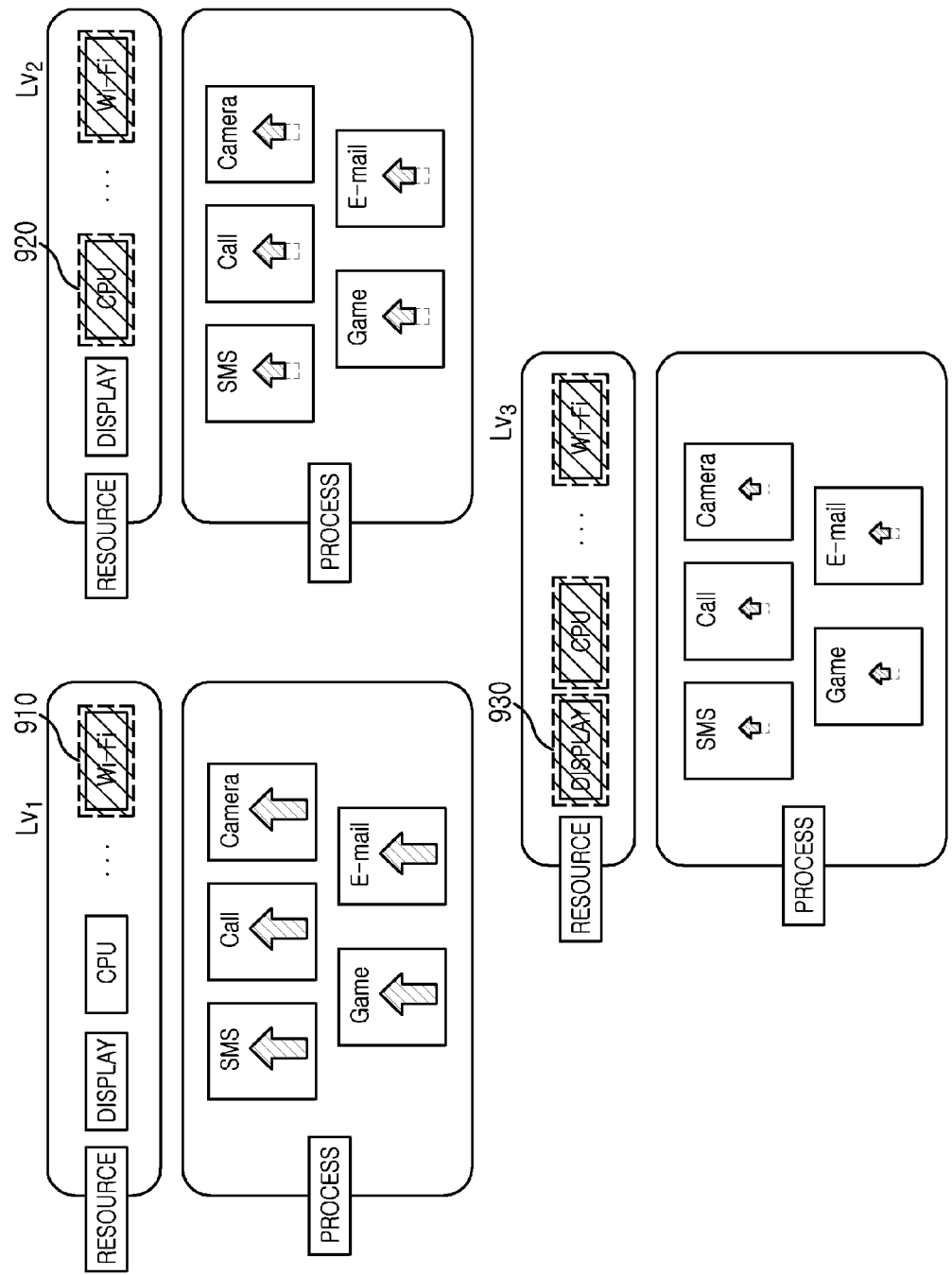
FIG. 9B is a diagram illustrating an example of a process for power management that utilizes the data structure of FIG. 9A.

FIGS. 9A and 9B are diagrams illustrating a resource control operation of an electronic device 101 according to various embodiments of the present disclosure.

Referring to FIG. 9A, a diagram of an example of a data structure mapping different battery levels to device resources, is shown. The data structure may be stored in the memory of the electronic device 101 or elsewhere. According to various embodiments, the electronic device 101 may define a battery reference level by time to guarantee an operation in a preset operation duration, and may compare a current battery level and the battery reference level and control resources of the electronic device 101.

According to various embodiments, the electronic device 101 may adjust the number of controlled resources in accordance with a difference level between the battery reference level and a measured battery level. For example, as illustrated in FIG. 9A, the electronic device 101 may define a plurality of levels, and identify one or more resources that are to be restricted when the electronic device enters that level. Each level in the data structure may be associated with a particular difference between the electronic device's present battery level and a value of a reference battery level that corresponds to a time at which the present battery level is measured (i.e., difference between present level of battery and reference battery level). Thus, the electronic device may be considered to enter a particular level of the data structure, when the difference between the present level of the battery of the electronic device and the reference battery level is greater than the difference associated with the particular level in the data structure and less than the difference associated with the next level in the data structure.

Furthermore, in another aspect, the data structure may effectively assign respective priorities to the resources by providing that some resources are to be restricted before others. As illustrated, the data structure of FIG. 9A specifies that Bluetooth and WiFi are to be restricted before the GPU and CPU of the device 101.

For example, as illustrated, the electronic device 101 may define a first level at which a difference of the battery level is small to a third level at which a difference of the battery level is large, and define a control resource corresponding to each level. As illustrated, the electronic device 101 may define the first level to control a BT module and a WIFI module, and define the second level to additionally control a CPU and a GPU. Further, the electronic device 101 may define the third level to additionally control a display module, a Radio Frequency (RF) module, and a Near Field Communication (NFC) module.

Referring to FIG. 9B, a diagram illustrating an example of a process for power management is shown that utilizes the data structure of FIG. 9A. As illustrated in FIG. 9B, if detecting a battery level difference corresponding to the first level, the electronic device 101 may deactivate a resource (for example, one WIFI resource 910) corresponding to the first level among a plurality of resources, thereby reducing battery consumption caused by an executed process. In the illustrated figure, an arrow included in each process represents a battery consumption amount generated by each process.

If detecting a battery level difference corresponding to the second level, the electronic device 101 may additionally control (i.e., restrict) a resource (for example, a CPU 920) corresponding to the second level, thereby reducing battery consumption caused by an executed process.

If detecting a battery level difference corresponding to the third level in a state of controlling resources, the electronic device 101 may additionally control (i.e., restrict) a resource (for example, a display module 930) corresponding to the third level, thereby further reducing the battery consumption.

Figure 10B:
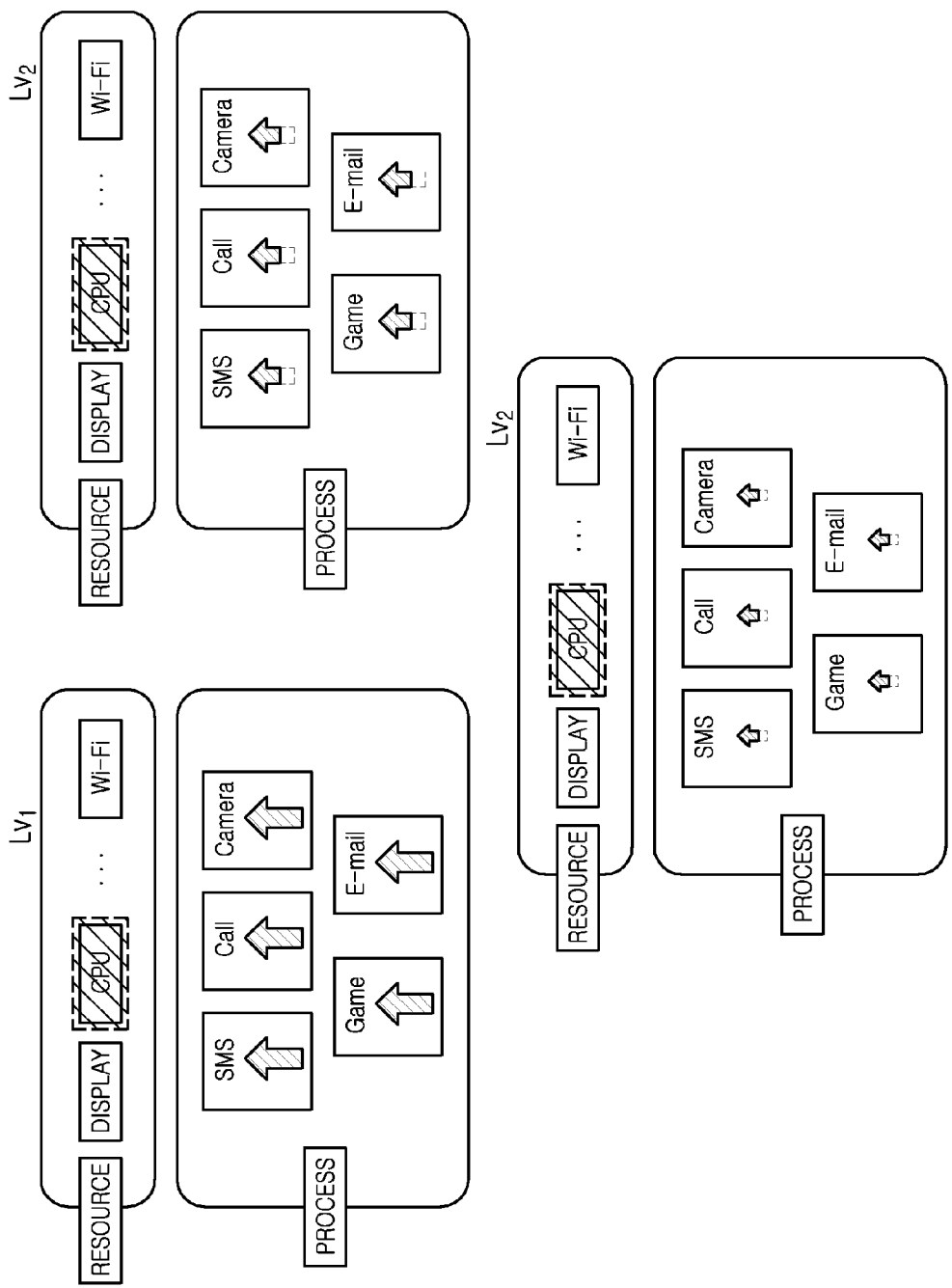
FIG. 10B is a diagram illustrating an example of a process for power management that utilizes the data structure of FIG. 10A.

FIGS. 10A and 10B are diagrams illustrating a resource control operation of an electronic device 101 according to various embodiments of the present disclosure.

Referring to FIG. 10A, a diagram of an example of a data structure mapping different battery levels to device resources, is shown. The data structure may be stored in the memory of the electronic device 101 or elsewhere. According to various embodiments, the electronic device 101 may define a battery reference level by time to guarantee an operation in a preset operation duration, and may compare a current battery level and the battery reference level and control (e.g., restrict) resources of the electronic device 101.

According to various embodiments, the electronic device 101 may adjust the performance of controlled resources in accordance with a difference level between the battery reference level and a measured battery level. For example, as illustrated in FIG. 10A, the electronic device 101 may define a plurality of levels in accordance with a size of a difference of the battery level, and define a control resource performance corresponding to each level.

For example, as illustrated, the electronic device 101 may define a first level at which a difference of the battery level is small to a third level at which a difference of the battery level is large, and define a control resource corresponding to each level. As illustrated, the electronic device 101 may scale down a CPU to 90% of its full capacity at the first level, scale down the CPU to 80% of its full capacity at the second level, and scale down the CPU to 70% of its full capacity.

Referring to FIG. 10B, a diagram illustrating an example of a process for power management is shown that utilizes the data structure of FIG. 10A. As illustrated in FIG. 10B, if checking a battery level difference corresponding to the first level, the electronic device 101 may control the resource performance corresponding to the first level, for example, the CPU to exhibit the maximum 90% performance, thereby reducing battery consumption caused by an executed process. In the illustrated figure, an arrow included in each process represents a battery consumption amount generated by each process.

If detecting a battery level difference corresponding to the second level, the electronic device 101 may control the resource performance corresponding to the second level, for example, the CPU to exhibit the maximum 80% performance and, if checking a battery level difference corresponding to the third level, the electronic device 101 may control the resource performance corresponding to the third level, for example, the CPU to exhibit the maximum 70% performance.

According to various embodiments, an operation method of an electronic device may include the operations of setting an operation time of the electronic device, measuring a battery level based on a variable period, and, based on the measured battery level, controlling resources of the electronic device to preserve a battery level required for operating during the set time.

According to various embodiments, the operation method of the electronic device may further include the operation of storing information about a resource that is controlled in accordance with the battery level.

According to various embodiments, the operation of controlling the resources of the electronic device may include the operation of controlling at least any one of the number of resources corresponding to the measured battery level, the kind of the resources, and the performance of the resources.

According to various embodiments, the operation method of the electronic device may further include the operation of controlling the controlled resource to be in a non-control state if the set time arrives in course of controlling the resources.

According to various embodiments, the operation of measuring the battery level based on the variable period may include the operation of setting a threshold value defining a battery level that is maintained as time goes in order to preserve a battery level required for operating during a predefined time.

According to various embodiments, the operation of measuring the battery level based on the variable period may include the operation of comparing the battery level and the predefined threshold value, and controlling a resource corresponding to the battery level of the threshold value.

According to various embodiments, the operation of setting the threshold value may include the operation of checking a battery level that is maintained by time for a currently executed function.

According to various embodiments, the operation of controlling the resources may include the operation of checking a resource that is controlled based on at least one of an importance and a priority order.

According to various embodiments, the operation of setting the operation time may include the operation of providing an operation start settable range based on a battery level of an operation time setting time point.

Figure 11:
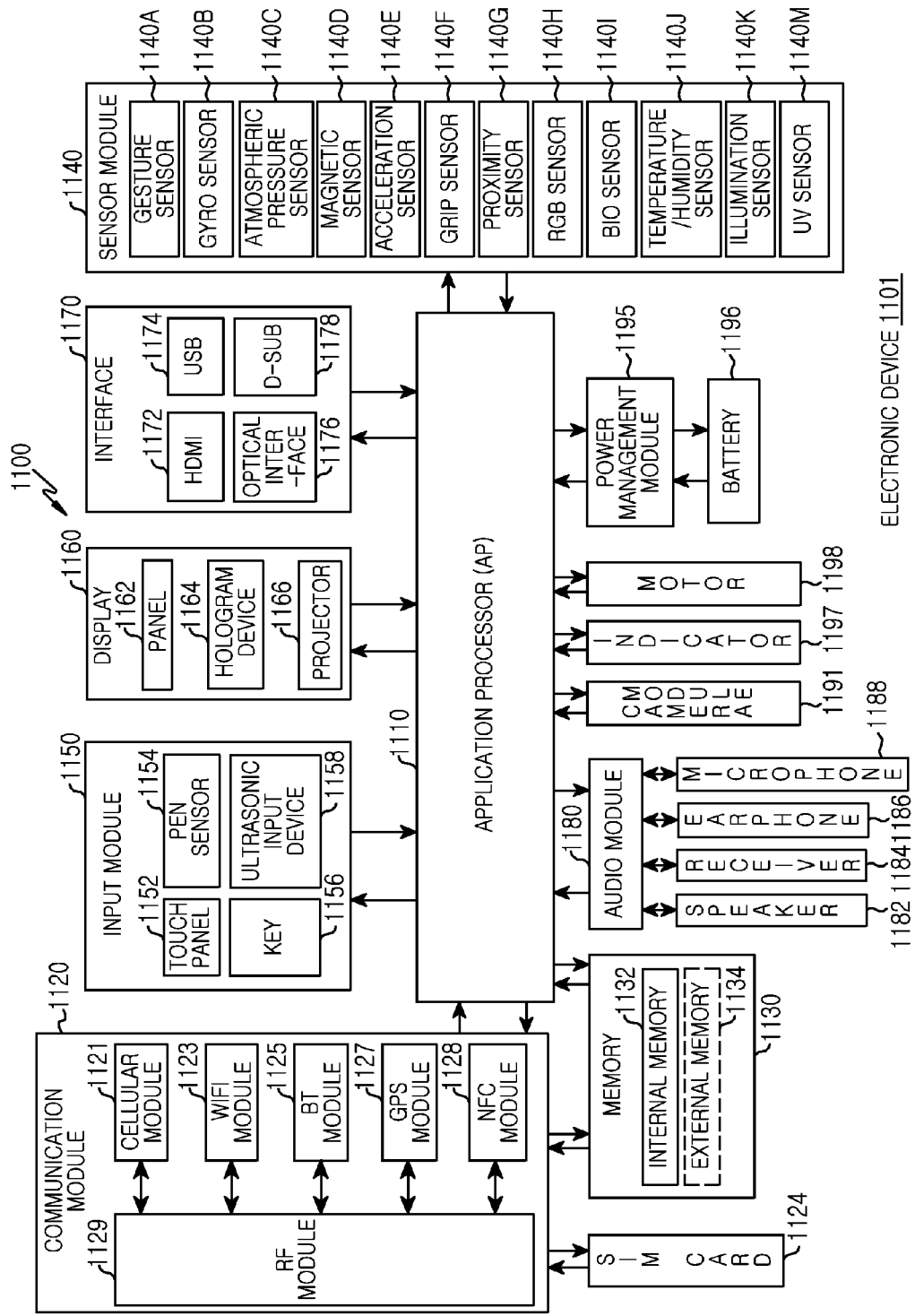
FIG. 11 illustrates a block diagram of an example of an electronic device, according to various embodiments of the present disclosure.

FIG. 11 is a block diagram 1100 illustrating an electronic device 1101 according to various embodiments of the present disclosure. The electronic device 1101 may configure, for example, all or a portion of the electronic device 101 illustrated in FIG. 1. Referring to FIG. 11, the electronic device 1101 may include one or more application processors (AP) 1110, a communication module 1120, a subscriber identification module (SIM) card 1124, a memory 1130, a sensor module 1140, an input unit 1150, a display 1160, an interface 1170, an audio module 1180, a camera module 1191, a power management module 1195, a battery 1196, an indicator 1197, or a motor 1198.

The AP 1110 may drive an OS or an application to control a plurality of hardware or software elements connected to the AP 1110, and perform various data processes including multimedia data and operations. The AP 1110 may be implemented, for example, as a system on chip (SoC). According to an embodiment, the AP 1110 may further include a graphic processing unit (GPU) (not shown).

The communication module 1120 (e.g., the communication interface 160) may perform data transmission/reception in communication between the electronic device 1101 (e.g., the electronic device 101) and other electronic devices (e.g., the electronic device 104 or the server 106) connected via a network. According to an embodiment, the communication module 1120 may include a cellular module 1121, a Wi-Fi module 1123, a BT module 1125, a GPS module 1127, an NFC module 1128, and a Radio Frequency (RF) module 1129.

The cellular module 1121 may provide voice communication, image communication, a short message service, or an Internet service, etc. via a communication network (e.g., LTE, LTE-A, CDMA, WCDMA, UMTS, WiBro, or GSM, etc.). Also, the cellular module 1121 may perform discrimination and authentication of an electronic device within a communication network using, for example, a subscriber identity module (e.g., a SIM card 1124). According to an embodiment, the cellular module 1121 may perform at least a portion of functions that may be provided by the AP 1110.

For example, the cellular module 1121 may perform at least a portion of a multimedia control function.

According to an embodiment, the cellular module 1121 may include a communication processor (CP). Also, the cellular module 1121 may be, for example, implemented as a SoC. Though elements such as the cellular module 1121 (e.g., a communication processor), the memory 1130, or the power management module 1195, etc. are illustrated as elements separated from the AP 1110 in FIG. 11, according to an embodiment, the AP 1110 may be implemented to include at least a portion (e.g., the cellular module 1121) of the above-described elements.

According to an embodiment, the AP 1110 or the cellular module 1121 (e.g., a communication processor) may load an instruction or data received from at least one of a non-volatile memory and other elements connected thereto onto a volatile memory, and process the same. Also, the AP 1110 or the cellular module 1121 may store data received from at least one of other elements or generated by at least one of other elements in a non-volatile memory.

Each of the Wi-Fi module 1123, the BT module 1125, the GPS module 1127, or the NFC module 1128 may include, for example, a processor for processing data transmitted/received via a relevant module. Though the cellular module 1121, the Wi-Fi module 1123, the BT module 1125, the GPS module 1127, or the NFC module 1128 are illustrated as separate blocks in FIG. 11, according to an embodiment, at least a portion (e.g., two or more elements) of the cellular module 1121, the Wi-Fi module 1123, the BT module 1125, the GPS module 1127, or the NFC module 1128 may be included in one Integrated Circuit (IC) or an IC package. For example, at least a portion (e.g., a communication processor corresponding to the cellular module 1121 and a Wi-Fi processor corresponding to the Wi-Fi module 1123) of processors corresponding to each of the cellular module 1121, the Wi-Fi module 1123, the BT module 1125, the GPS module 1127, or the NFC module 1128 may be implemented as one SoC.

The RF module 1129 may perform transmission/reception of data, for example, transmission/reception of an RF signal. The RF module 1129 may include, for example, a transceiver, a power amp module (PAM), a frequency filter, or a low noise amplifier (LNA), etc., though not shown. Also, the RF module 1129 may further include a part for transmitting/receiving an electromagnetic wave on a free space in wireless communication, for example, a conductor or a conducting line, etc. Though FIG. 11 illustrates the cellular module 1121, the Wi-Fi module 1123, the BT module 1125, the GPS module 1127, and the NFC module 1128 share one RF module 1129, according to an embodiment, at least one of the cellular module 1121, the Wi-Fi module 1123, the BT module 1125, the GPS module 1127, or the NFC module 1128 may perform transmission/reception of an RF signal via a separate RF module.

The SIM card 1124 may be a card including a subscriber identity module, and may be inserted into a slot formed in a specific position of the electronic device. The SIM card 1124 may include unique identify information (e.g., integrated circuit card identifier (ICCID)) or subscriber information (e.g., international mobile subscriber identity (IMSI)).

The memory 1130 (e.g., the memory 110) may include a built-in memory 1132 or an external memory 1134. The built-in memory 1132 may include, for example, at least one of a volatile memory (e.g., dynamic RAM (DRAM), static RAM (SRAM), synchronous dynamic RAM (SDRAM)) and a non-volatile memory (e.g., one-time programmable ROM (OTPROM), programmable ROM (PROM), erasable and programmable ROM (EPROM), electrically erasable and programmable ROM (EEPROM), mask ROM, flash ROM, NAND flash memory, NOR flash memory, etc.).

According to an embodiment, the built-in memory 1132 may be a Solid State Drive (SSD). The external memory 1134 may further include a flash drive, for example, compact flash (CF), secure digital (SD), micro secure digital (Micro-SD), mini secure digital (Mini-SD), extreme digital (xD), or a memory stick. The external memory 1134 may be functionally connected with the electronic device 1101 via various interfaces. According to an embodiment, the electronic device 1101 may further include a storage device (or a storage medium) such as a hard drive.

The sensor module 1140 may measure a physical quantity or detect an operation state of the electronic device 1101, and convert the measured or detected information to an electric signal. The sensor module 1140 may include, for example, at least one of a gesture sensor 1140A, a gyro sensor 1140B, an atmospheric pressure sensor 1140C, a magnetic sensor 1140D, an acceleration sensor 1140E, a grip sensor 1140F, a proximity sensor 1140G, a color sensor 1140H (e.g., RGB (red, green, blue) sensor), a living body sensor 11401, a temperature/humidity sensor 1140J, an illuminance sensor 1140K, or an ultra violet (UV) sensor 1140M. Additionally or alternatively, the sensor module 1140 may include, for example, an E-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), or a fingerprint sensor (not shown), etc. The sensor module 1140 may further include a control circuit for controlling at least one sensor belonging thereto.

The input unit 1150 may include a touch panel 1152, a (digital) pen sensor 1154, a key 1156, or an ultrasonic input unit 1158. The touch panel 1152 may recognize a touch input using at least one of capacitive, resistive, infrared, or ultrasonic methods. Also, the touch panel 1152 may further include a control circuit. A capacitive touch panel may perform detection by a physical contact or proximity recognition. The touch panel 1152 may further include a tactile layer. In this case, the touch panel 1152 may provide a tactile reaction to a user.

The (digital) pen sensor 1154 may be implemented using, for example, a method which is the same as or similar to receiving a user's touch input, or using a separate sheet for detection. The key 1156 may include, for example, a physical button, an optical key or keypad. The ultrasonic input unit 1158 is a unit for recognizing data by detecting a sound wave using a microphone (e.g., a microphone 1188) in the electronic device 1101 via an input tool generating an ultrasonic signal, and enables wireless recognition. According to an embodiment, the electronic device 1101 may receive a user input from an external device (e.g., a computer or a server) connected to the communication module 1120 using the communication module 1120.

The display 1160 (e.g., the display 150) may include a panel 1162, a hologram device 1164, or a projector 1166. The panel 1162 may be, for example, a liquid crystal display (LCD), or an active-matrix organic light-emitting diode (AM-OLED), etc. The panel 1162 may be implemented, for example, such that it is flexible, transparent, or wearable. The panel 1162 may be configured as one module together with the touch panel 1152. The hologram device 1164 may show a three-dimensional image in the air using interferences of light. The projector 1166 may project light onto a screen to display an image. The screen may be positioned, for example, inside or outside the electronic device 1101. According to an embodiment, the display 1160 may further include a control circuit for controlling the panel 1162, the hologram device 1164, or the projector 1166.

The interface 1170 may include, for example, a high-definition multimedia interface (HDMI) 1172, a universal serial bus (USB) 1174, an optical interface 1176, or a D-subminiature (D-sub) 1178. The interface 1170 may be included, for example, in the communication interface 160 illustrated in FIG. 1. Additionally or alternatively, the interface 1170 may include, for example, a mobile high-definition link (MHL) interface, a secure digital (SD) card/multimedia card (MMC) interface, or an infrared data association (IrDA) standard interface.

The audio module 1180 may convert a sound and an electric signal in dual directions. At least a partial element of the audio module 1180 may be included, for example, in the I/O interface 140 illustrated in FIG. 1. The audio module 1180 may process sound information input or output via, for example, a speaker 1182, a receiver 1184, an earphone 1186, or a microphone 1188, etc.

The camera module 1191 is a device that may shoot a still image and a moving picture. According to an embodiment, the camera module 1191 may include one or more image sensors (e.g., a front sensor or a rear sensor), a lens (not shown), an image signal processor (ISP) (not shown), or a flash (not shown) (e.g., an LED or xenon lamp).

The power management module 1195 may manage power of the electronic device 1101. Though not shown, the power management module 1195 may include, for example, a power management integrated circuit (PMIC), a charger integrated circuit (IC), or a battery or a battery or fuel gauge.

The PMIC may be mounted, for example, inside an integrated circuit or a SoC semiconductor. A charging method may be classified into a wired charging method and a wireless charging method. The charging IC may charge a battery and prevent introduction of an overvoltage or an overcurrent from a charger. According to an embodiment, the charging IC may include a charging IC for at least one of the wired charging method and the wireless charging method. The wireless charging method may be, for example, a magnetic resonance method, a magnetic induction method, or an electromagnetic wave method, etc., and may additionally include an additional circuit for wireless charging, for example, a circuit such as a coil loop, a resonance circuit, or a rectifier, etc.

The battery gauge may measure, for example, a remnant of the battery 1196, a voltage, a current, or a temperature while charging. The battery 1196 may store or generate electricity, and supply power to the electronic device 1101 using the stored or generated electricity. The battery 1196 may include, for example, a rechargeable battery or a solar battery.

The indicator 1197 may display a specific state of the electronic device 1101 or a portion thereof (e.g., the AP 1110), for example, a booting state, a message state, or a charging state, etc. The motor 1198 may convert an electric signal to mechanical vibration. Though not shown, the electronic device 1101 may include a processor (e.g., a GPU) for supporting a mobile TV. The processor for supporting the mobile TV may process media data corresponding to standards, for example, such as digital multimedia broadcasting (DMB), digital video broadcasting (DVB), or a media flow, etc.

Each of the above-described elements of the electronic device according to the present disclosure may be configured using one or more components, and a name of a relevant element may change depending on a kind of the electronic device. An electronic device according to the present disclosure may include at least one of the above-described elements, and a portion of the elements may be omitted, or additional other elements may be further included. Also, a portion of the elements of the electronic device according to the present disclosure may combine to form one entity and equally perform a function of the relevant elements before the combination.

A terminology "module" used for the present disclosure may mean, for example, a unit including a combination of one or two or more among a hardware, a software, or a firmware. A "module" may be interchangeably used with a terminology such as a unit, a logic, a logical block, a component, or a circuit, etc. A "module" may be a minimum unit of an integrally configured part or a portion thereof. A "module" may be a minimum unit performing one or more functions or a portion thereof. A "module" may be mechanically or electronically implemented. For example, a "module" according to the present disclosure may include at least one of an application-specific integrated circuit (ASIC) chip, a field-programmable gate arrays (FPGAs), or a programmable-logic device which are known, or to be developed in the future, and performing certain operations.

According to various embodiments, at least a portion of an apparatus (e.g., modules or functions thereof) or a method (e.g., operations) according to the present disclosure may be implemented as an instruction stored in a computer-readable storage media, for example, in the form of a programming module. An instruction, when executed by one or more processors (e.g., the processor 120), may allow the one or more processors to perform a function corresponding to the instruction. The computer-readable storage media may be, for example, the memory 130. At least a portion of a programming module may be implemented (e.g., executed) by, for example, the processor 120. At least a portion of the programming module may include, for example, a module, a program, a routine, sets of instructions, or a process, etc. for performing one or more functions.

The computer-readable storage media may include a hard disk, a magnetic media such as a floppy disk and a magnetic tape, Compact Disc Read Only Memory (CD-ROM), optical media such as Digital Versatile Disc (DVD), magneto-optical media such as a floptical disk, and a hardware device specially configured for storing and performing a program instruction (e.g., a programming module) such as Read Only Memory (ROM), Random Access Memory (RAM), a flash memory, etc. Also, the program instruction may include not only a machine language code generated by a compiler but also a high-level language code executable by a computer using an interpreter, etc. The above-described hardware device may be configured to operate as one or more software modules in order to perform an operation of the present disclosure, and vice versa.

A module or a programming module according to the present disclosure may include at least one of the above-described elements, omit a portion thereof, or further include additional other elements. Operations performed by a module, a programming module, or other elements according to the present disclosure may be executed in a sequential, parallel, or heuristic method. Also, a portion of the operations may be executed in a different sequence, omitted, or other operations may be added.

According to various embodiments, a storage medium storing instructions is provided. The instructions, when executed by at least one processor, are set to allow the at least one processor to perform at least one operation. The at least one operation may include setting an operation time of the electronic device, measuring a battery level based on a variable period, and based on the measured battery level, controlling resources of the electronic device to preserve a battery level required for operating during the set time.

A method and apparatus for power management in an electronic device according to various embodiments of the present disclosure may, for example, control resources in accordance with a battery consumption amount and preserve a battery level such that the electronic device may operate during a time designated by a user.

Also, embodiments of the present disclosure disclosed in the present specification and drawings merely suggest specific examples so as to easily describe the technological content of the present disclosure and help the understanding of the present disclosure, and do not intend to limit the spirit and scope of the present disclosure. Accordingly, it should be understood that the scope of the present disclosure includes all modifications or changes drawn on the basis of the technological spirit of the present disclosure besides the embodiments disclosed herein.

FIGS. 1-11 are provided as an example only. At least some of the steps discussed with respect to these figures can be performed concurrently, performed in a different order, and/or altogether omitted. It will be understood that the provision of the examples described herein, as well as clauses phrased as "such as," "e.g.", "including", "in some aspects," "in some implementations," and the like should not be interpreted as limiting the claimed subject matter to the specific examples.

The above-described aspects of the present disclosure can be implemented in hardware, firmware or via the execution of software or computer code that can be stored in a recording medium such as a CD-ROM, a Digital Versatile Disc (DVD), a magnetic tape, a RAM, a floppy disk, a hard disk, or a magneto-optical disk or computer code downloaded over a network originally stored on a remote recording medium or a non-transitory machine-readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for".

While the present disclosure has been particularly shown and described with reference to the examples provided therein, it will be understood by those skilled in the art that various changes in form and details may be made therein without departing from the spirit and scope of the present disclosure as defined by the appended claims.

What is claimed is:

1. An electronic device comprising:
   a battery; and
   a controller configured to: measure a battery level at a first time point;
   compare the measured battery level with a reference battery level corresponding to the first time point; and
   restrict an operation of at least one resource of the electronic device based on the measured battery level if the measured battery level is smaller than the reference battery level corresponding to the first time point,
   wherein the reference battery level is determined to have different values over time to guarantee an operation of the electronic device during a time duration specified by a user input,
   wherein restricting the operation of the at least one resource comprises lowering a performance level of the resource or deactivating the at least one resource, and
   wherein the controller is configured to remove one or more restrictions placed on the operation of the resource in response to a specified time duration passing.

2. The electronic device of claim 1, wherein the controller is configured to determine a difference between the measured battery level of the first time point and reference battery level corresponding to the first time point, and determine, based on the difference, the at least one resource among a plurality of resources.

3. The electronic device of claim 1, wherein the controller is configured to determine the at least one resource among a plurality of resources based on a priority of each of the plurality of resources.

4. The electronic device of claim 1, further comprising a memory storing a mapping between the at least one resource and one or more battery level tiers, wherein the operation of the at least one resource is restricted based on the mapping.

5. The electronic device of claim 1, wherein the at least one resource comprises at least one of a hardware component and a software component.

6. An electronic device comprising:
   a battery; and
   a controller configured to: measure a battery level at a first time point;
   compare the measured battery level with a reference battery level corresponding to the first time point; and
   restrict an operation of at least one resource of the electronic device based on the measured battery level if the measured battery level is smaller than the reference battery level corresponding to the first time point,
   wherein the reference battery level is determined to have different values over time to guarantee an operation of the electronic device during a time duration specified by a user input, and
   wherein the controller is configured to measure a battery level at a second time point while restricting the operation of the at least one resource, compare the measured battery level of the second time point with a reference battery level corresponding to the second time point, and remove one or more restrictions placed on the operation of the at least one resource if the measured battery level of the second time point is larger than or equal to the reference battery level corresponding to the second time point.

7. A method comprising:
   detecting an input specifying a time duration during which an electronic device is required to remain operational;
   measuring a battery level at a first time point;
   comparing the measured battery level with a reference battery level corresponding to the first time point; and
   based on the measured battery level, restricting an operation of at least one resource of the electronic device,
   wherein the reference battery level is determined to have different values over time to guarantee an operation of the electronic device during the time duration, and
   wherein restricting the operation of the at least one resource comprises lowering a performance level of the resource or deactivating the at least one resource,
   the method further comprising:
   removing one or more restrictions placed on the resource in response to a time period passing.

8. The method of claim 7, wherein the at least one resource is determined based on the measured battery level.

9. The method of claim 7, further comprising:
   determining a difference between the measured battery level of the first time point and reference battery level corresponding to the first time point; and
   determining, based on the difference, the at least one resource among a plurality of resources.

10. The method of claim 7, further comprising:
    measuring a battery level at a second time point while restricting the operation of the at least one resource;
    comparing the measured battery level of the second time point with a reference battery level corresponding to the second time point; and
    removing one or more restrictions placed on the operation of the at least one resource if the measured battery level of the second time point is larger than or equal to the reference battery level corresponding to the second time point.

11. The method of claim 9, wherein the reference battery level is determined based on whether a particular function is executed.

12. The method of claim 7, further comprising determining the at least one resource among a plurality of resources based on a priority of each of the plurality of resources.

13. The method of claim 7, further comprising displaying an interface for specifying the time duration.

14. The method of claim 1, wherein the at least one resource comprises at least one of a hardware component and a software component.

* * * * *